(12) United States Patent
Tsujimoto et al.

(10) Patent No.: US 6,616,799 B2
(45) Date of Patent: Sep. 9, 2003

(54) SHEET REMOVING APPARATUS AND METHOD

(75) Inventors: Masaki Tsujimoto, Urawa (JP); Kenji Kobayashi, Omiya (JP); Kimihiko Kawasaki, Ina-machi (JP)

(73) Assignee: Lintec Corporation (JP)

( * ) Notice: Subject to any disclaimer, the term of this patent is extended or adjusted under 35 U.S.C. 154(b) by 0 days.

(21) Appl. No.: 09/755,384

(22) Filed: Jan. 3, 2001

(65) Prior Publication Data
US 2001/0017189 A1 Aug. 30, 2001

(30) Foreign Application Priority Data
Feb. 24, 2000 (JP) ......................................... 2000-047647

(51) Int. Cl.$^7$ ............................................... B32B 35/00
(52) U.S. Cl. .................. 156/344; 156/247; 156/584
(58) Field of Search ................ 156/344, 584, 156/247; 430/256, 259

(56) References Cited

U.S. PATENT DOCUMENTS

| | | | | |
|---|---|---|---|---|
| 4,285,759 A | * | 8/1981 | Allen et al. | 156/584 |
| 4,685,991 A | * | 8/1987 | Herrmann et al. | 156/344 |
| 4,752,346 A | * | 6/1988 | Platzer | 156/344 |
| 4,775,438 A | * | 10/1988 | Funakoshi et al. | 156/230 |
| 5,009,735 A | * | 4/1991 | Ametani et al. | 156/241 |
| 5,254,201 A | * | 10/1993 | Konda et al. | 156/344 |
| 5,282,918 A | * | 2/1994 | Heist et al. | 156/344 |
| 5,310,442 A | * | 5/1994 | Ametani | 156/353 |
| 5,441,846 A | * | 8/1995 | Nagate et al. | 430/259 |
| 5,492,590 A | * | 2/1996 | Sakai | 156/344 |
| 5,891,298 A | * | 4/1999 | Kuroda et al. | 156/241 |
| 6,149,758 A | | 11/2000 | Tsujimoto et al. | 156/344 |
| 6,238,515 B1 | * | 5/2001 | Tsujimoto et al. | 156/379.8 |
| 6,500,291 B1 | * | 12/2002 | Okada et al. | 156/230 |
| 6,500,298 B1 | * | 12/2002 | Wright et al. | 156/344 |
| 6,503,130 B2 | * | 1/2003 | Lim | 451/285 |

FOREIGN PATENT DOCUMENTS

| | | | | |
|---|---|---|---|---|
| JP | 11-016862 | 6/1997 | | H01L/21/304 |
| JP | 11-163105 | 11/1997 | | H01L/21/68 |

* cited by examiner

*Primary Examiner*—Mark A. Osele
(74) *Attorney, Agent, or Firm*—Marger Johnson & McCollom, P.C.

(57) ABSTRACT

A protecting sheet applied to a wafer is removed by using an adhesive tape with a prescribed length, by bonding the adhesive tape to an edge portion of the protecting sheet and then pulling the adhesive tape. During pulling, a guide roller is held in contact with the protecting sheet and, while the guide roller is held in a fixed position, a peeling head portion and a table are moved in the opposite direction with each other to thereby remove the protecting sheet.

12 Claims, 15 Drawing Sheets

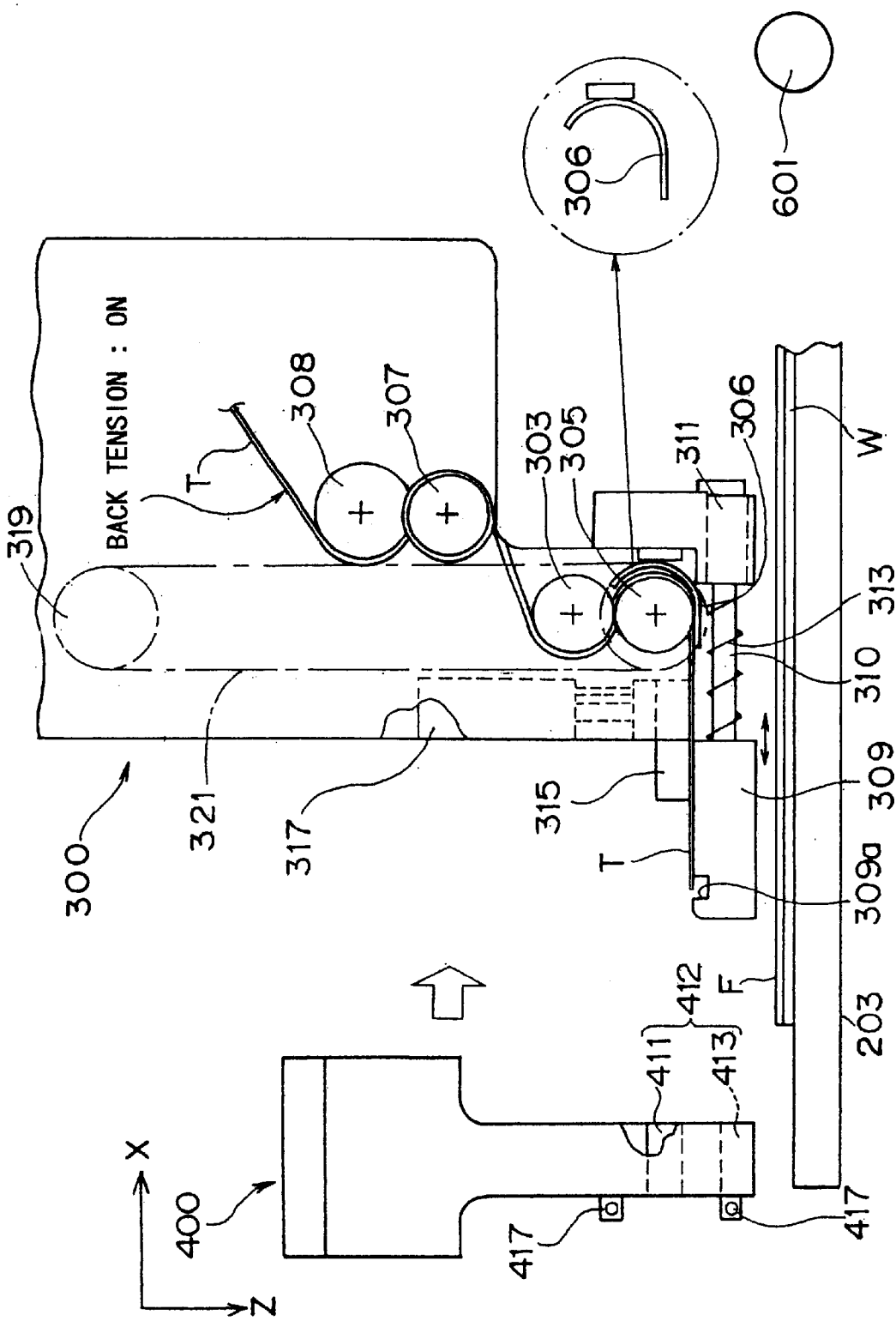

SHEET REMOVING APPARATUS AND METHOD

BACKGROUND OF THE INVENTION

1. Field of the Invention

The present invention relates to an apparatus and a method for removing a sheet applied to a plate-shaped member such as a semiconductor wafer.

2. Description of the Prior Art

When a semiconductor is manufactured, a grinding process is carried out on the underside surface of a semiconductor wafer (hereafter referred to simply as "wafer") in order to create a thin, miniaturized semiconductor chip, but before such grinding process is carried out, a protecting sheet made from an adhesive film or the like is bonded to the upper surface (i.e., the surface formed with the circuit) of the wafer. Then, after grinding is completed, the protecting sheet is removed.

In Japanese Laid-Open Publication No. 11-16862, the present inventors have proposed a novel method of removing a protecting sheet applied to a plate-shaped member by using an adhesive tape with a prescribed length wherein the adhesive tape is bonded to an end of the sheet and the adhesive tape is pulled to remove the sheet.

As a result of repeated experimentation, it has been observed that, in the foregoing method, there is a risk that the sheet is occasionally stretched or torn off along the outer periphery thereof when the adhesive tape is pulled in a direction parallel to the plane of the wafer in order to remove the sheet.

SUMMARY OF THE INVENTION

It is an object of the present invention to remove without failure the sheet applied to the plate-shaped member without resulting stretching or tear of the sheet.

To achieve the foregoing object, the present invention provides an apparatus for removing a sheet applied to a plate-shaped member by using an adhesive tape with a prescribed length by bonding the adhesive tape to an edge portion of the sheet followed by pulling the adhesive tape, characterized by comprising means for pulling the sheet obliquely upwardly.

The means for pulling the sheet obliquely upwardly may comprise guide means for guiding the direction of pull of the sheet. The term "obliquely upwardly" is intended to mean a direction excluding the direction parallel to the wafer surface and includes, for example, a direction wherein the angle formed with the wafer surface is 5°–175°. The direction of pull may be the same as the direction in which the sheet is applied or, alternatively, the sheet may be pulled in the reverse direction.

In another aspect, the present invention provides an apparatus for removing a sheet applied to a plate-shaped member by using an adhesive tape with a prescribed length by bonding the adhesive tape to an end of the sheet followed by pulling the adhesive tape, characterized by comprising a guide roller disposed in the vicinity of the sheet to ensure that the sheet is pulled as it is turned over the guide roller. In this case, the guide roller may be disposed in such a position as to prevent upward movement of the plate-shaped member.

According to a still another aspect of the invention, there is provided a method for removing a sheet applied to a plate-shaped member by using an adhesive tape with a prescribed length, the method comprising the steps of bonding said adhesive tape to an end of the sheet and pulling the adhesive tape obliquely upwardly to thereby remove the sheet away from the plate-shaped member.

According to a further aspect of the invention, there is provided a method for removing a sheet applied to a plate-shaped member by using an adhesive tape with a prescribed length, the method comprising the steps of bonding the adhesive tape to an end of the sheet and pulling the adhesive tape with the sheet turned over a guide roller.

It should be noted that even though the present invention is particularly suited to removing a protecting sheet applied to a wafer, the present invention is not limited to such case, and instead the present invention provides a general apparatus and method for using an adhesive tape to remove a sheet applied to a plate-shaped member. The plate-shaped member may further include glass plate, plastic plate, painted steel plate, ceramic plate, printed circuit board, liquid crystal plate, optical element plate, etc. The present invention can be applied to remove a protecting sheet applied to these members.

BRIEF DESCRIPTION OF THE DRAWINGS

FIGS. 6–14 are explanatory drawings showing the sheet removing operations.

DETAILED DESCRIPTION OF THE PREFERRED EMBODIMENTS

Figure 1:
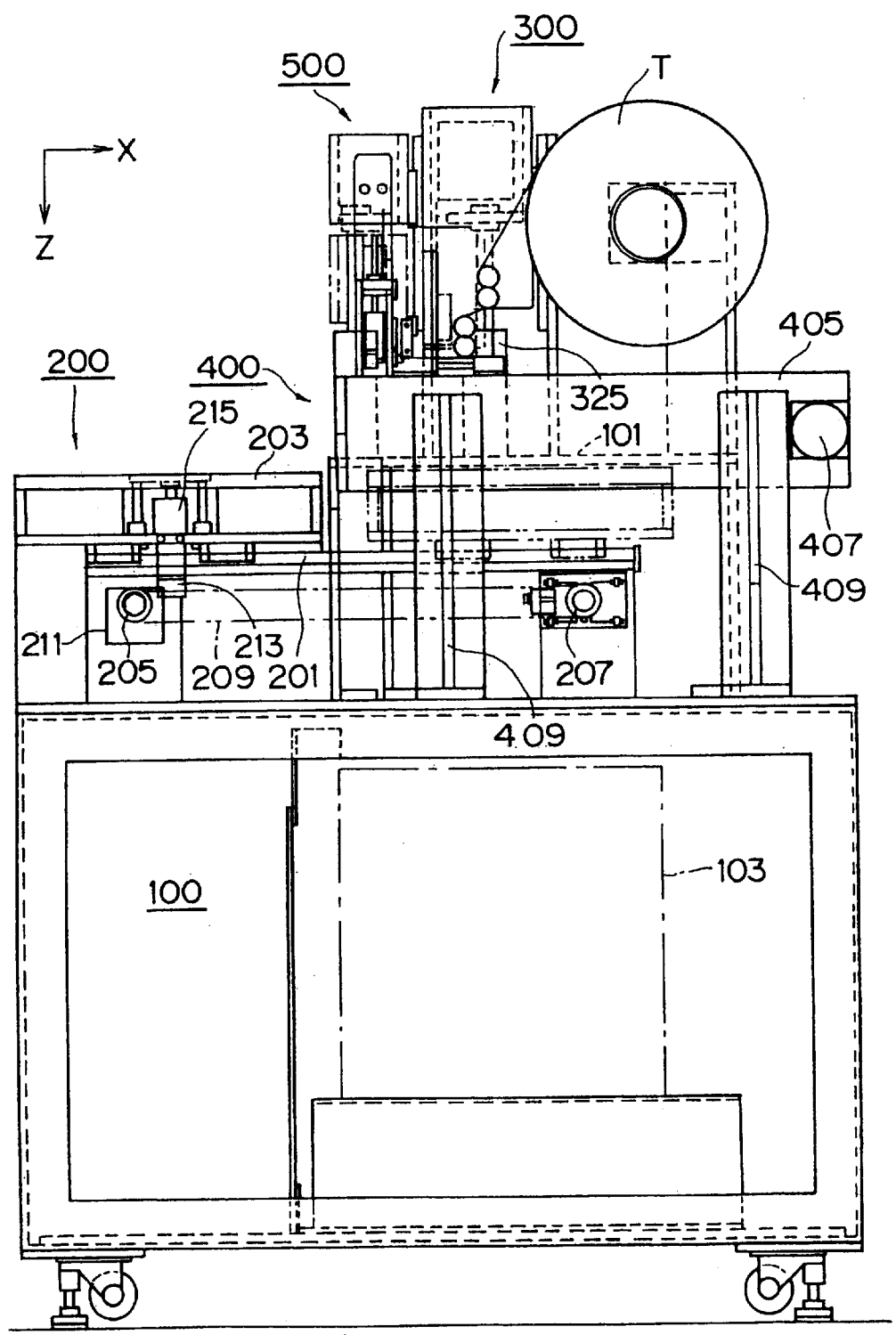
FIG. 1 is a front view of a sheet removing apparatus according to the present invention.
Figure 2:
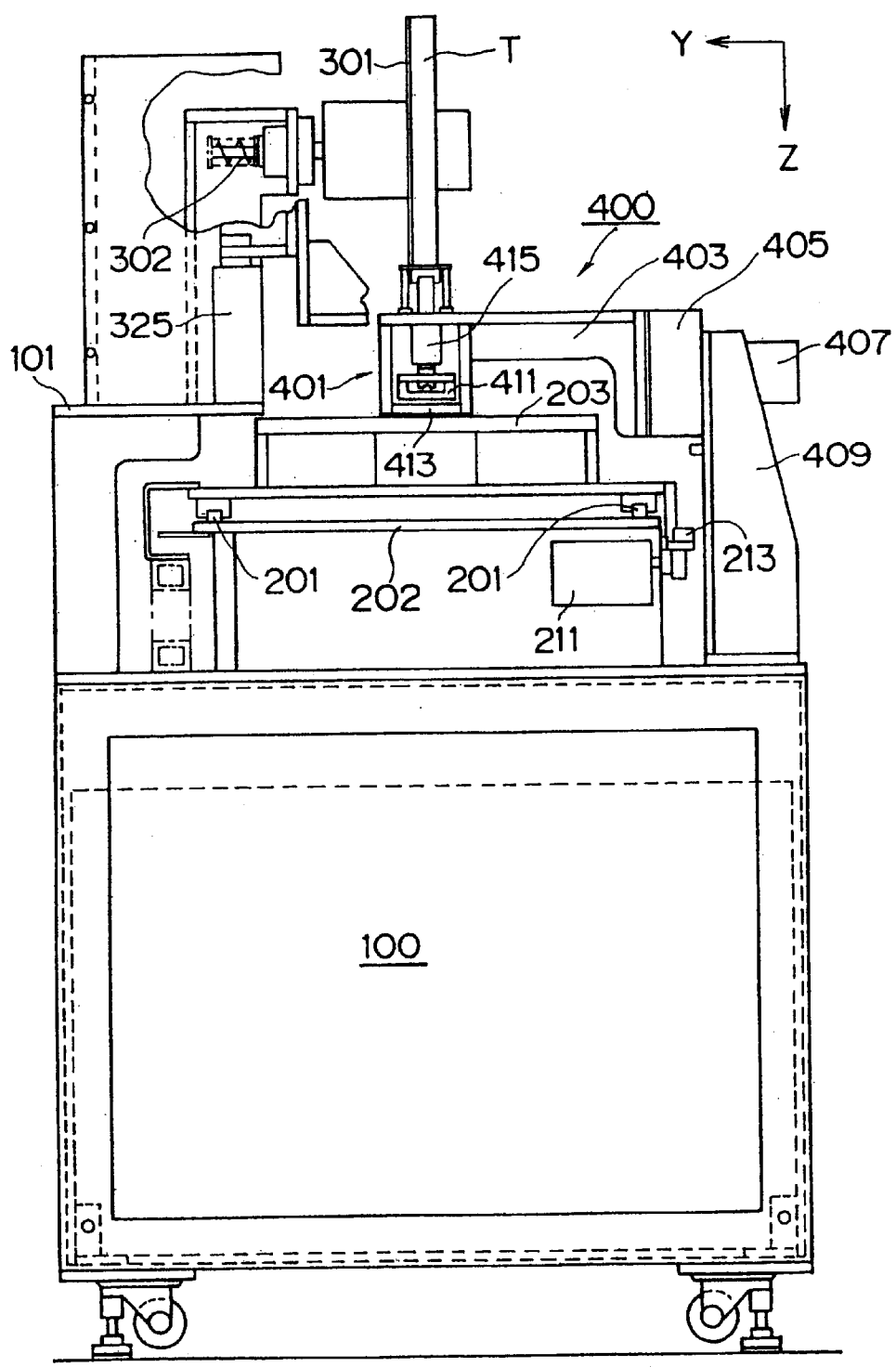
FIG. 2 is a side view of the sheet removing apparatus according to the present invention.
Figure 3:
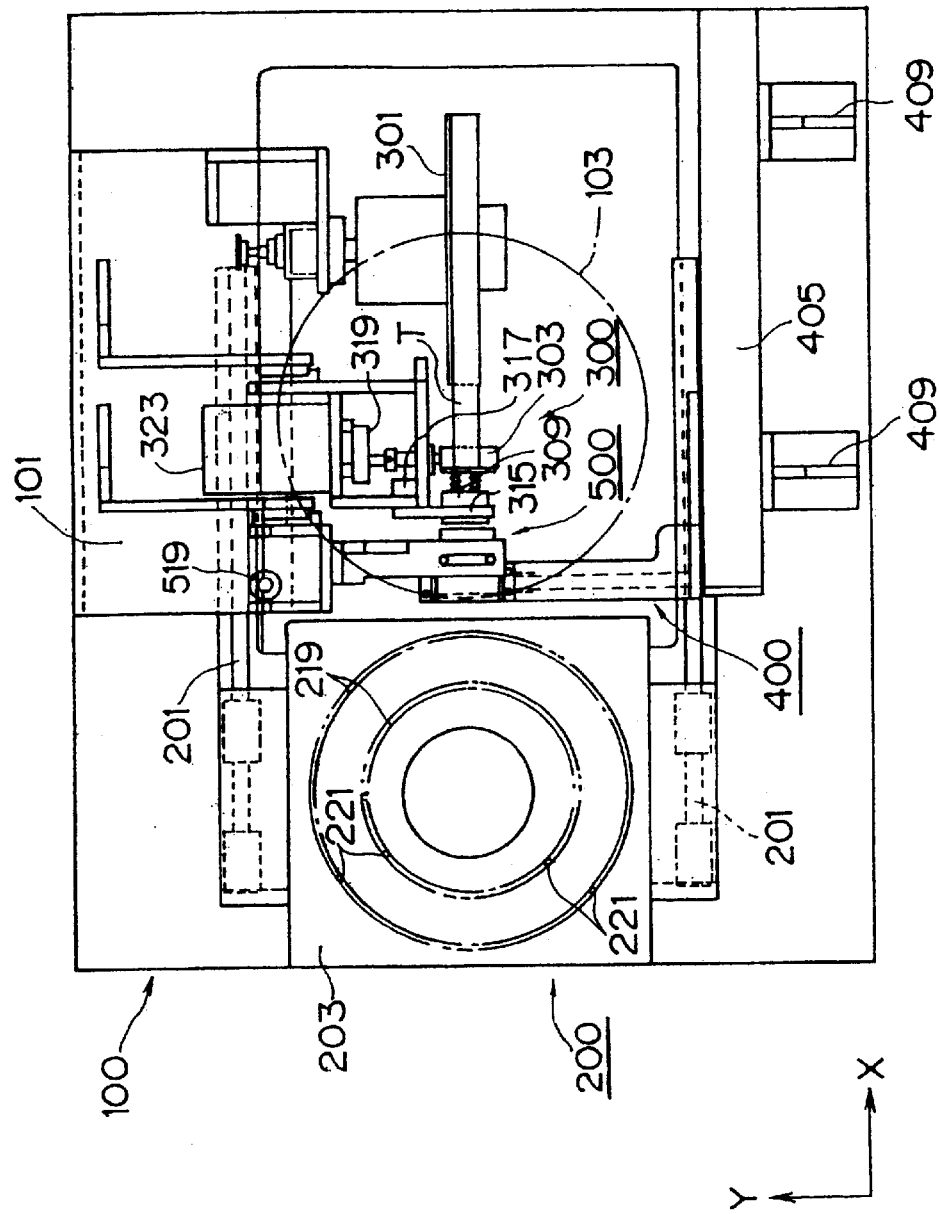
FIG. 3 is a plan view of the sheet removing apparatus according to the present invention.

The present invention will be described below, by way of an example, with reference to an apparatus for removing protecting sheets of wafers. FIGS. 1, 2 and 3 are a front elevational view, a side elevational view and a top plan view, respectively, showing the sheet removing apparatus according to an embodiment of the present invention. The sheet removing apparatus is constructed from a platform 100, a table portion 200, a tape supplying portion 300, a peeling head portion 400, and a heating/cutting portion 500 as bonding means and cutting means.

Figure 13:
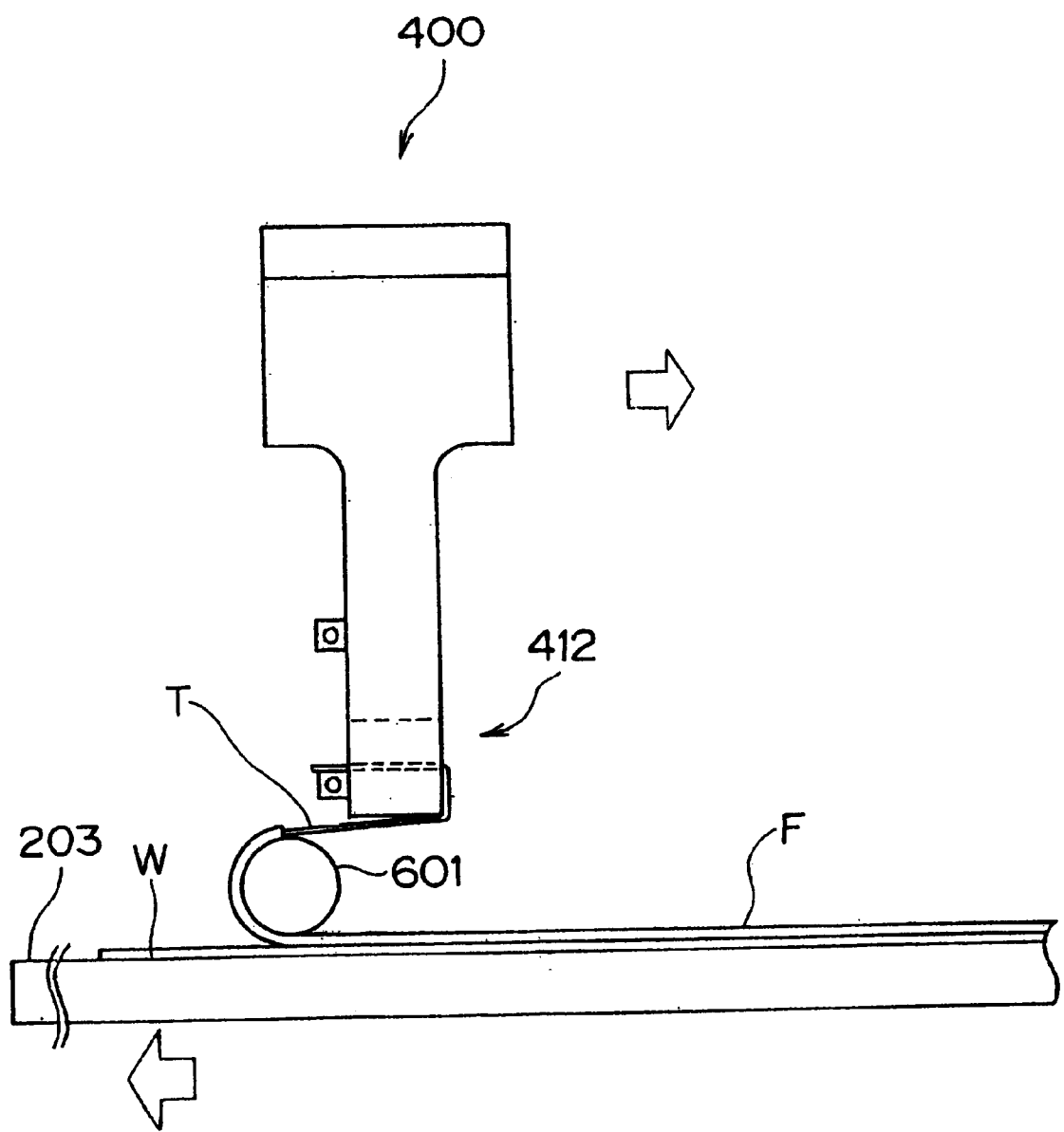

First, in describing the general structure of the sheet removing apparatus, a wafer W which has a protecting sheet bonded thereto is conveyed by the table 200. Meanwhile, the adhesive tape T, which is supplied from the tape supplying portion 300, is drawn out by the peeling head portion 400. Next, the heating/cutting portion 500 bonds the adhesive tape T by means of heat press to an edge portion of the protecting sheet, and then cuts the adhesive tape T to a prescribed length. Then, the peeling head portion 400 grasps and pulls the adhesive tape to remove the protecting sheet off the wafer W. During removing of the adhesive tape T, a guide roller is held in contact with the removed portion of the protecting sheet F (FIG. 13). A detailed description of each portion is given below.

The table portion 200 is equipped with two guide rails 201 provided above the platform 100 and a table 203 which is provided on the guide rails 201 so as to be movable in the X direction shown in FIG. 3. The guide rails 201 are laid on a base plate 202 (FIG. 2). Further, a belt 209 is suspended between pulleys 205, 207 above the platform 100, with the pulley 205 being rotated by a motor 211. The belt 209 is connected to the table 203 by a coupling 213, and in this way the table 203 can be moved along the guide rails 201 by the rotation of the motor 211.

The table 203 is moved up and down by a cylinder 205. The table 203 is also provided with a plurality of concentric annular suction grooves 219 arranged in conformity with the diameter of the wafers, each suction groove 219 being provided with a plurality of suction ports which are subjected to a negative pressure to retain the wafers by suction. Shown at 221 are movable positioning pins, there being two such positioning pins provided in the vicinity of the suction grooves 219 to permit the end of the wafers to be brought into abutment with the two positioning pins 221 to thereby ensure positioning of the wafers.

In this embodiment, the adhesive tape T comprises a heat-sensitive adhesive tape made by providing a heat-resistant film such as polyethylene terephthalate with a heat-sensitive adhesive, but it is also possible to use a heat-sensitive adhesive tape made by providing a base material with a heat-sensitive adhesive property. The adhesive tape T is set on the reel 301 and supplied to the tape supplying portion 300. Further, a spring 302 (FIG. 2) is provided on the rotation shaft of the reel 301 to apply a frictional force via a friction plate to the rotation shaft of the reel 301.

As shown in FIG. 6, the tape supplying portion 300 is equipped with a pinch roller 303 and a tension roller 305 which are in mutual compressive contact with each other, a guide roller 307, and a pinch roller 308. The lower end portion of the tape supplying portion 300 is equipped with a tape receiving plate 309 provided on a ball bush 311 via a shaft 310. The tape receiving plate 309, which is movable in the X-axis direction, is normally biased in a protruding direction (i.e., towards the left in FIG. 6) by a spring 313.

After being supplied out of the reel 301 and passed between the pinch roller 308 and the guide roller 307, the direction of the adhesive tape T is switched, and then after being further passed between the pinch roller 303 and the tension roller 305, the adhesive tape T is sent to the tape receiving plate 309, where it is pressed against the top of the tape receiving plate 309 by a tape pressing plate 315. A cutter groove 309a is formed in the front end portion of the tape receiving plate 309, and the tape pressing plate 315 is driven by a cylinder 317. Further, a timing belt 321 is suspended at the tension roller 305 from a timing pulley 319, and the timing pulley 319 is driven by a motor 323 (FIG. 3). The tension roller 305 rotates in a direction opposite the feeding direction of the adhesive tape T in order to apply a tensile force (back tension) on the adhesive tape T in the direction opposite the feeding direction.

The rear portion of the tension roller 305 (the right side in FIG. 6) is provided with a tape pressing guide 306 to prevent retrogression of the adhesive tape T on top of the tape receiving plate 309.

The tape supplying portion 300 is movable in the vertical direction (the Z-axis direction in FIG. 6). Namely, as shown in FIG. 2, the tape feeding portion 300 is moved in the Z-axis direction by a cylinder 325 which is fixed to a base plate 101 provided on the platform portion 100.

As is further shown in FIG. 2, the peeling head portion 400 is equipped with a peeling head 401 and an arm 403 for supporting the peeling head 401, with the arm 403 being provided on a guide 405 so as to be freely movable in the X-axis direction. The arm 403 is driven by a motor 407 provided at an end portion of the guide 405 via a power transmission mechanism (not shown in the drawings). The guide 405 is mounted above the platform 100 by means of a support plate 409.

The peeling head 401 is equipped with a tape chuck 412 comprised of an upper jaw 411 and a lower jaw 413, with the upper jaw 411 being moved by a cylinder 415 to open and close the tape chuck 412. The peeling head 401 is also provided with a detection sensor 417 (such as a photoelectric sensor or the like; see FIG. 6) to detect whether or not the adhesive tape T is present inside the tape chuck 412.

Figure 4A:
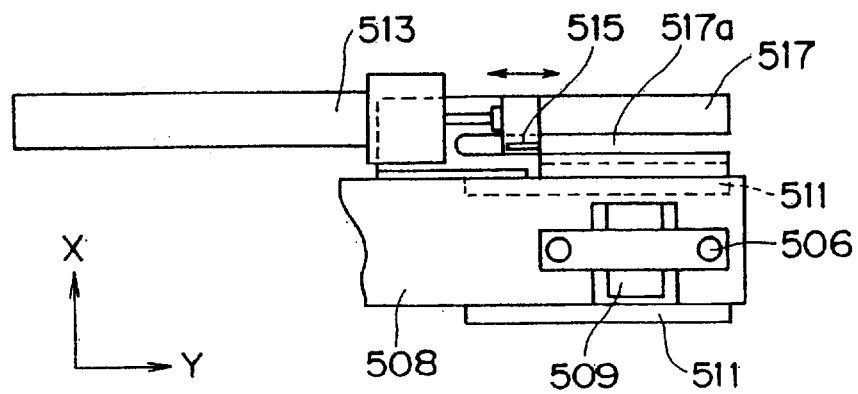
FIGS. 4A and 4B are respectively plan and side views of a heating/cutting portion of the sheet removing apparatus.
Figure 4B:
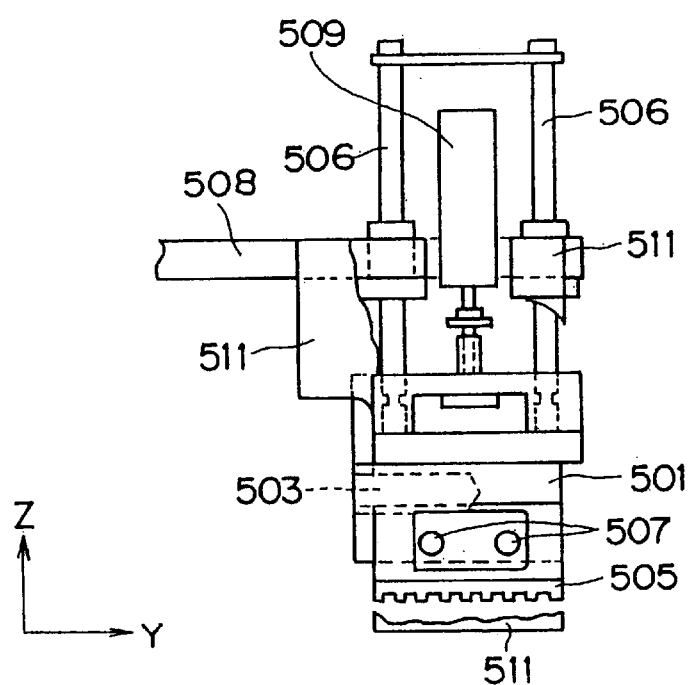
Figure 9:
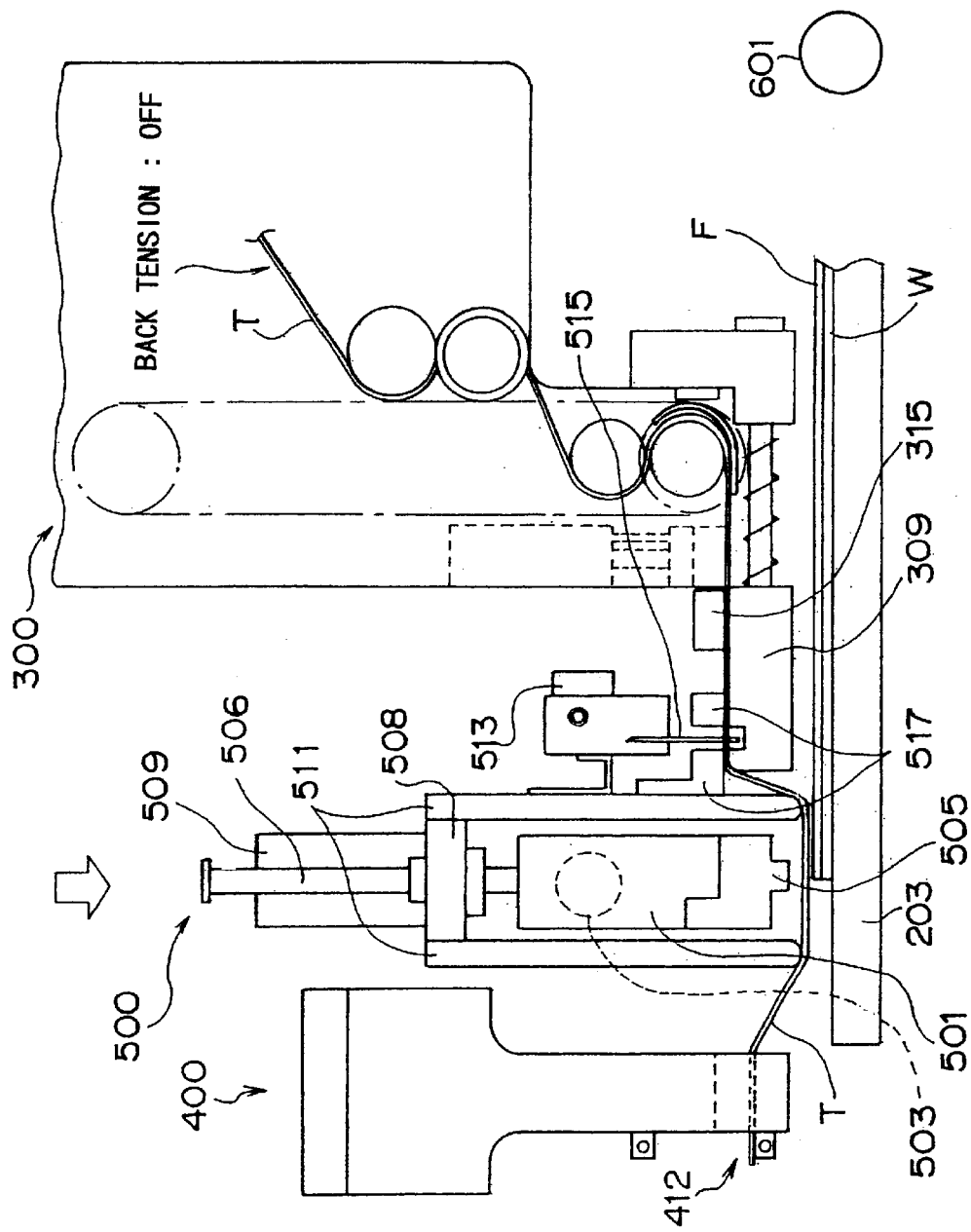

Next, a description of the heating/cutting portion 500 will be given. In this connection, FIG. 4A is an enlarged plan view of the heating/cutting portion 500, and FIG. 4B is a side view thereof. Further, a front view of the heating/cutting portion 500 is illustrated in FIG. 9. As shown in these drawings, a rod shaped heater 503 is embedded in a heating block 501, and a heat tool 505 is fixed to the lower end of the heating block 501 by means of a screw 507. The lower end of the heat tool 505 is formed to have an uneven shape like that shown in FIG. 4B to enable heat to be applied locally by convex portions thereof. Further, the heat tool 505 is replaceable to enable variously shaped tools to be used in accordance with size and curvature of the wafers. The heating block 501 is mounted on a frame 508 by means of two guide shafts 506 so as to be freely movable in the vertical direction (the Z-axis direction shown in the drawings), and is raised and lowered by a cylinder 509 fixed to the frame 508.

As shown in FIG. 4A, the heating block 501 is sandwiched in front and back (in the X-axis direction) between two plate-shaped tape pressing guides 511 mounted to the frame 508. The tape pressing guides 511 are heat insulating members made, for example, from a material such as polyimide resin or polyether ether ketone resin. The upper ends of the tape pressing guides 511 are fixed to the frame 508 and the lower ends are rounded so as to be freely capable of pressing the adhesive tape T. Further, a cutter moving cylinder 513 is mounted on the side of one of the tape pressing guides 511 (FIG. 4A), and mounted to a piston tip portion of the cylinder 513 is a cutting blade 515 which is reciprocally moved in the Y-axis direction by the movement of the cylinder 513. Arranged below the cylinder 513 is a plate-shaped tape press 517, and a slit 517a is formed in the tape press 517 to enable the passage of the cutting blade 515.

The heating/cutting portion 500 is movable in the vertical direction (the Z-axis direction in the drawings). Namely, the heating/cutting portion 500 is moved in the Z-axis direction by a cylinder 519 (FIG. 3) which is fixed to the base plate 101.

Figure 5A:
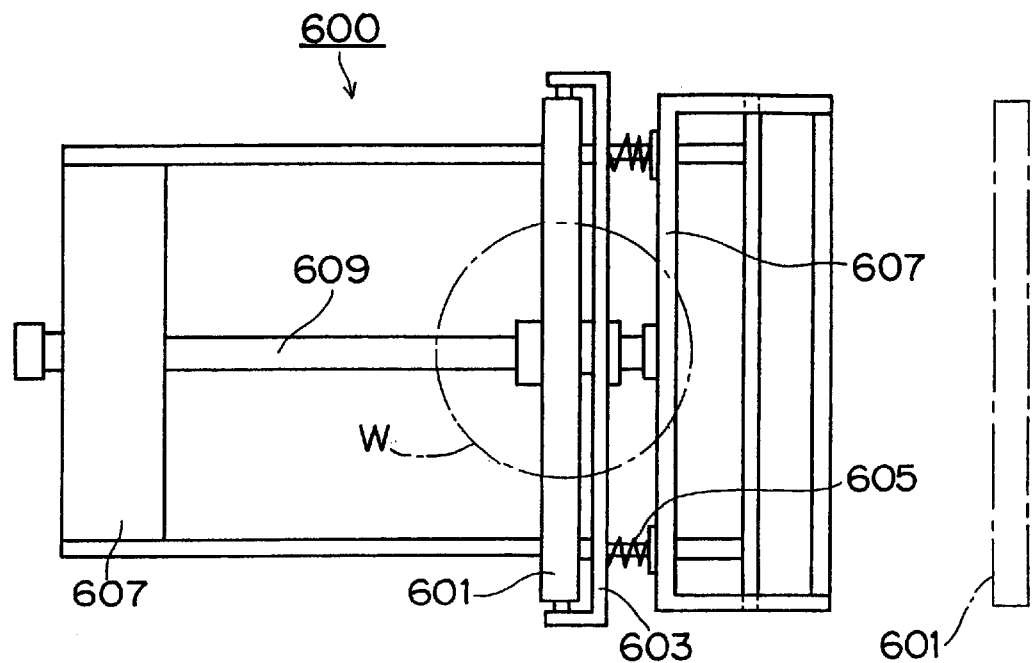
FIGS. 5A and 5B are respectively plan and side view of a guide roller unit of the sheet removing apparatus.
Figure 5B:
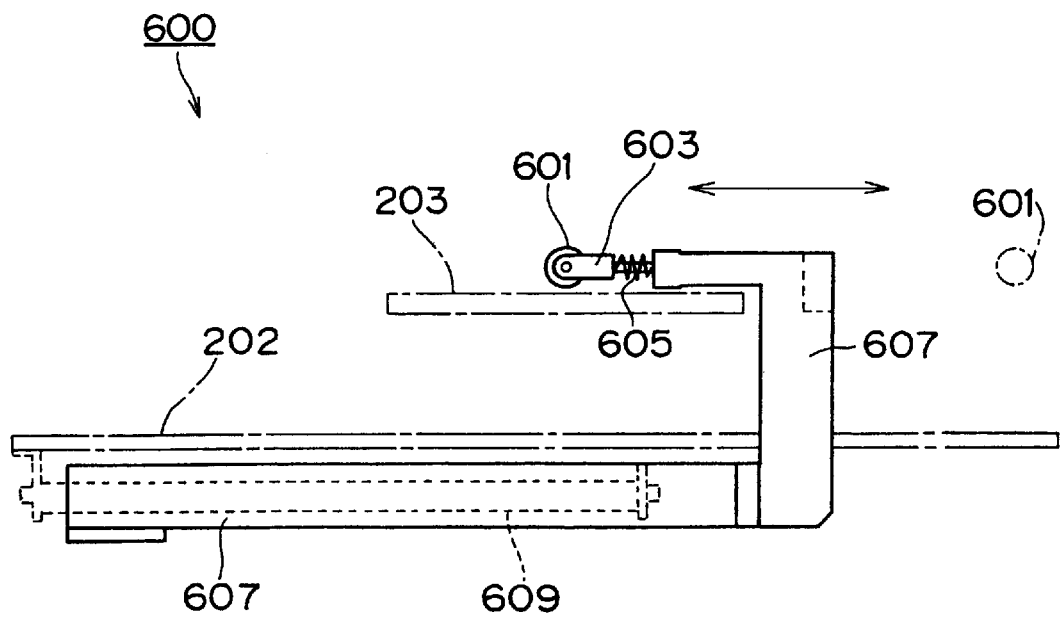

FIG. 5 illustrates a guide roller unit 600 which is used to remove the protecting sheet F, the guide roller unit 600 being mounted on the base plate 202 (FIG. 2) of the body of the apparatus. The guide roller unit 600 is comprised of a guide roller 601, a bracket 603 for rotatably supporting the guide roller 601, a frame 607 to which the frame 603 is mounted by way of a spring 605, and a cylinder 609 for moving the frame 607 in the direction of travel of the wafers W. The cylinder 609 is mounted on the base plate 202. When not in use, the guide roller 601 is placed in the stand-by position shown by the dotted line.

Next, the operation of the sheet removing apparatus will be described in the following Steps 1–8.

(Step 1: Setting the Wafer in place)

The wafer W is set in place on the table 203 manually or by an automated supplying device such as a manipulator. After the wafer W is aligned with the suction groove 219 in the table 203 which corresponds to the size of the wafer W, a vacuum device (not shown in the drawings) is operated to hold the wafer W by suction, and then the table 203 is moved directly below the tape supplying portion 300 (FIG. 6). At this moment, the guide roller 601 is in the stand-by position shown in FIG. 6.

At the tape supplying portion 300, the adhesive tape T is suspended in advance through the guide roller 307, the pinch roller 303 and the tension roller 305 in that respective order, and the adhesive tape T is held near the tip portion thereof by the tape press 315 and the tape receiving plate 309. Further, the tension roller 305 is driven to apply an appropriate back tension to the adhesive tape T.

At this time, the tape chuck 412 of the peeling head portion 400 is open. Then, the peeling head portion 400 is moved in the X-axis direction toward the tape feeding portion 300. Further, this movement of the peeling head portion 400 may be carried out simultaneously with the movement of the table 203.

(Step 2: Gripping the Tip of the Adhesive Tape T)

Figure 7:
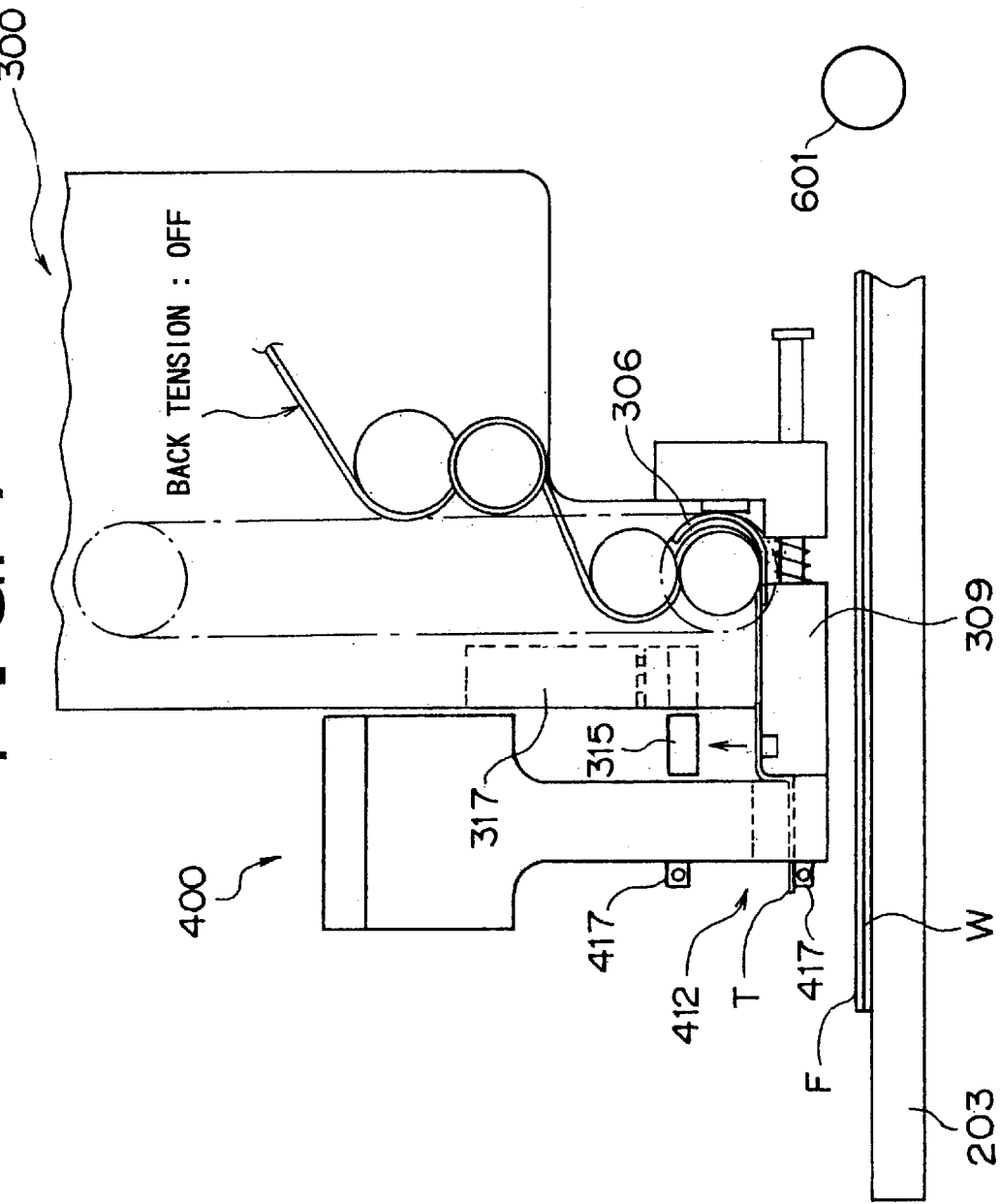

As shown in FIG. 7, the peeling head portion 400 pushes the tape receiving plate 309, thereby, the tape receiving plate 309 moves backwards and the tip of the adhesive tape T is inserted into the entrance portion of the tape chuck 412. At this time, because the adhesive tape T is held between the tension roller 305 and the pinch roller 303, and the adhesive tape T is pushed from the rear by the tape pushing guide 306, only the tape receiving plate 309 moves backwards without causing the adhesive tape T to move backward with the tape receiving plate 309, and in this way the tip of the adhesive tape T is reliably inserted in the entrance portion of the tape chuck 412. When the tip of the adhesive tape T is detected by the sensor 417, the tape chuck 412 is closed to grasp the tip of the adhesive tape T. Next, the back tension created by the tension roller 305 is released and the tape pressing plate 315 is raised and separated from the adhesive tape T.

(Step 3: Pulling Out the Adhesive Tape T)

Figure 8:
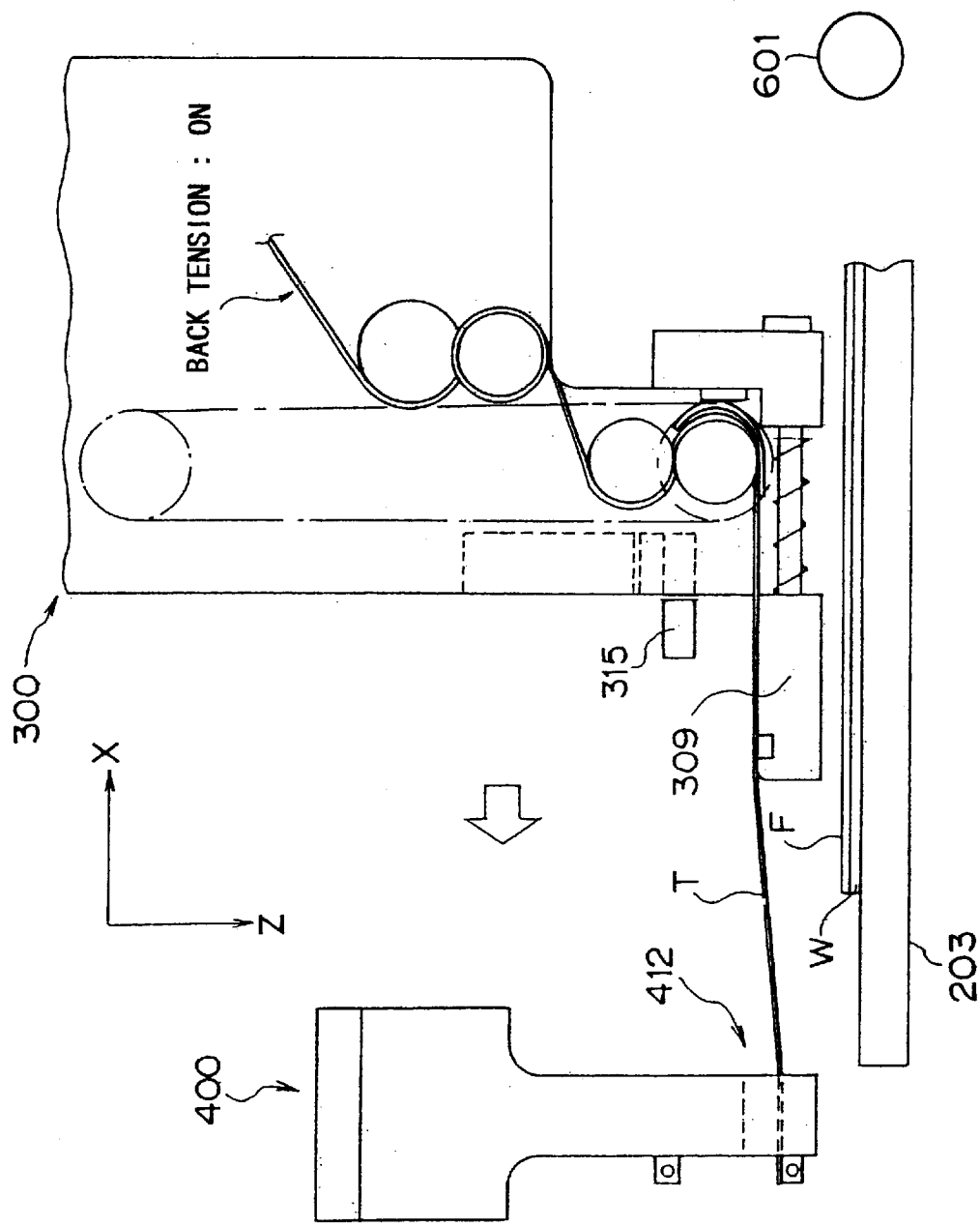

As shown in FIG. 8, the peeling head portion 400 is moved in the X-axis direction away from the tape feeding portion 300, and this causes the adhesive tape T to be pulled out. At this time, the tension roller 305 is operated to apply back tension.

(Step 4: Heat Pressing Bond and Cutting of the Tape T)

As shown in FIG. 9, the heating/cutting portion 500 is lowered, and the tape pressing guides 511 push the adhesive tape T downward to the vicinity of the wafer W. The adhesive tape T is pressed on the tape receiving plate 309 by the tape pressing plate 517, 315. After that, the heater raising/lowering cylinder 509 is driven to press the heat tool 505 against the protecting sheet F on the tip portion of the wafer W for several seconds, and in this way the adhesive tape T is bonded to the protecting sheet F by heat pressing. At this time, the position of the table 203 is adjusted in accordance with the size of the wafer W. In this connection, the table 203 may be moved to a position directly below the heating/cutting portion 500 by the time the adhesive tape T undergoes heat pressing bond. Then, the cutting blade 515 is moved in the Y-axis direction to cut the adhesive tape T to a prescribed length.

(Step 5: Raising the Tape Supplying Portion and the Heating/Cutting Portion)

Figure 10:
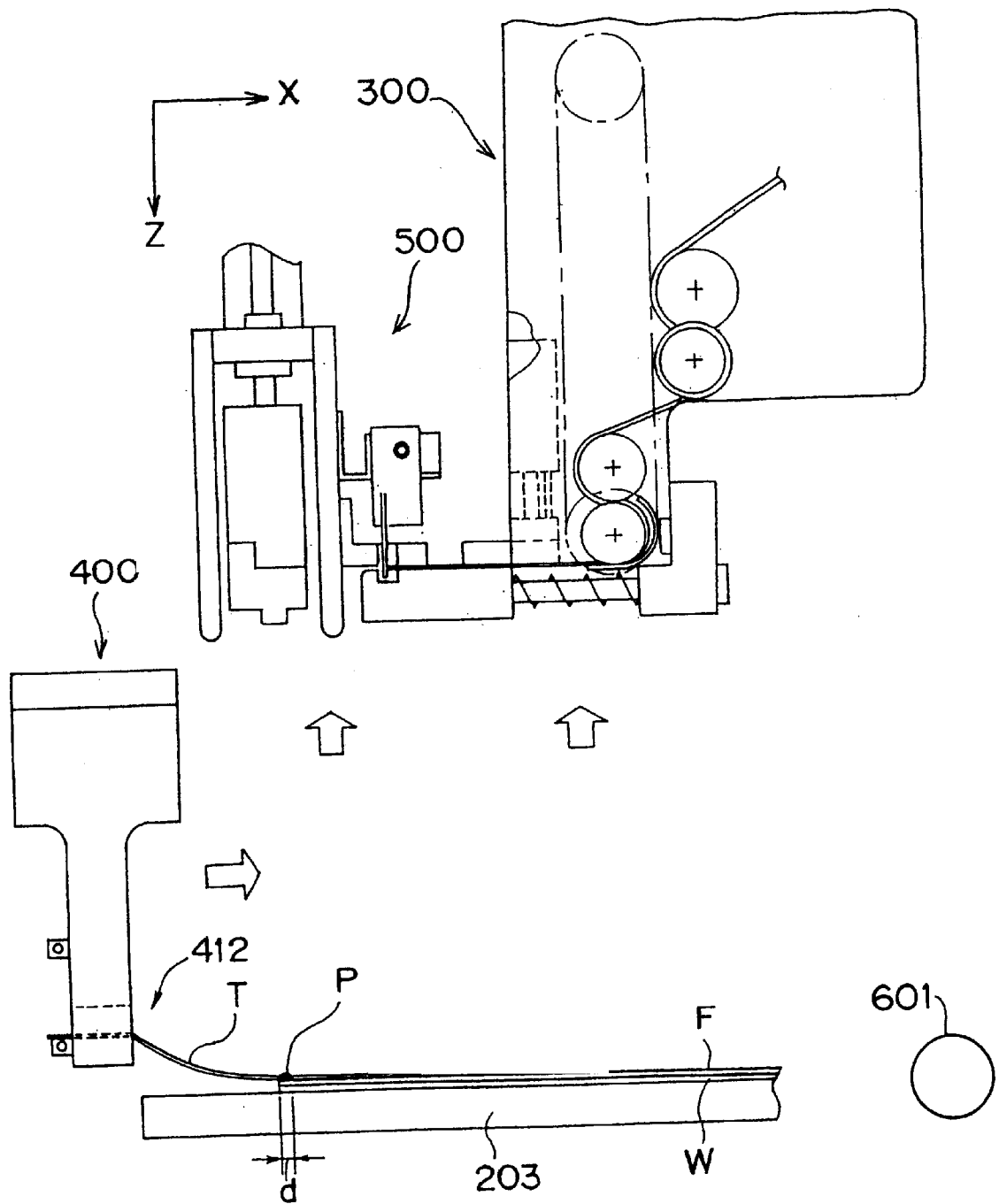

As shown in FIG. 10, the tape supplying portion 300 and the heating/cutting portion 500 are raised. As shown in this drawing, the bonding point P of the adhesive tape T and the protecting sheet F is near the edge of the wafer W. For example, a distance d from the edge of the wafer W to the bonding point P is within 3 mm.

(Step 6: Removing the Protecting Sheet)

Figure 11:
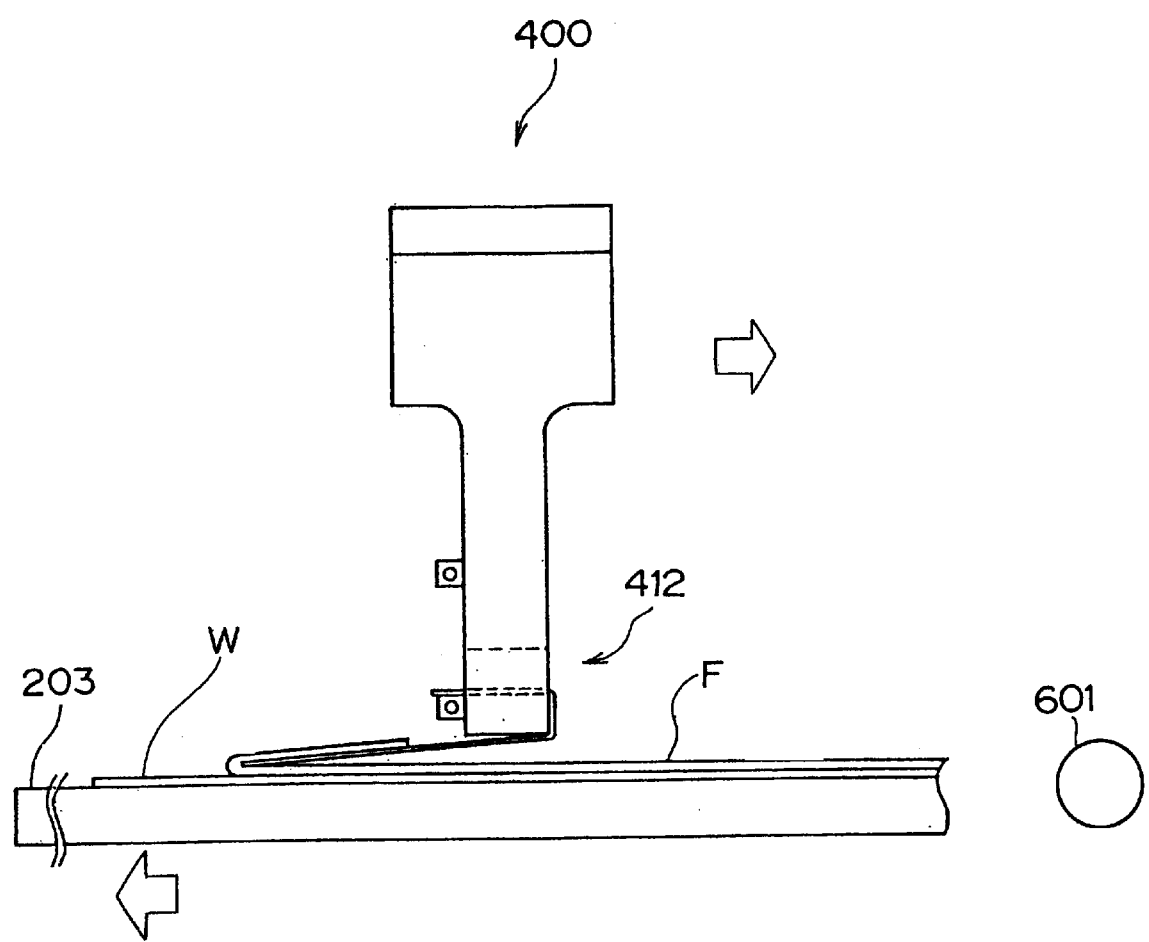

As shown in FIG. 11, the peeling head portion 400 is moved to the right in the drawing by the motor 407, and the table 203 is moved to the left in the drawing by the motor 211, whereby the protecting sheet F is held and peeled off the wafer W by the peeling head portion 400. Thus, the edge of protecting sheet F is removed.

Figure 12:
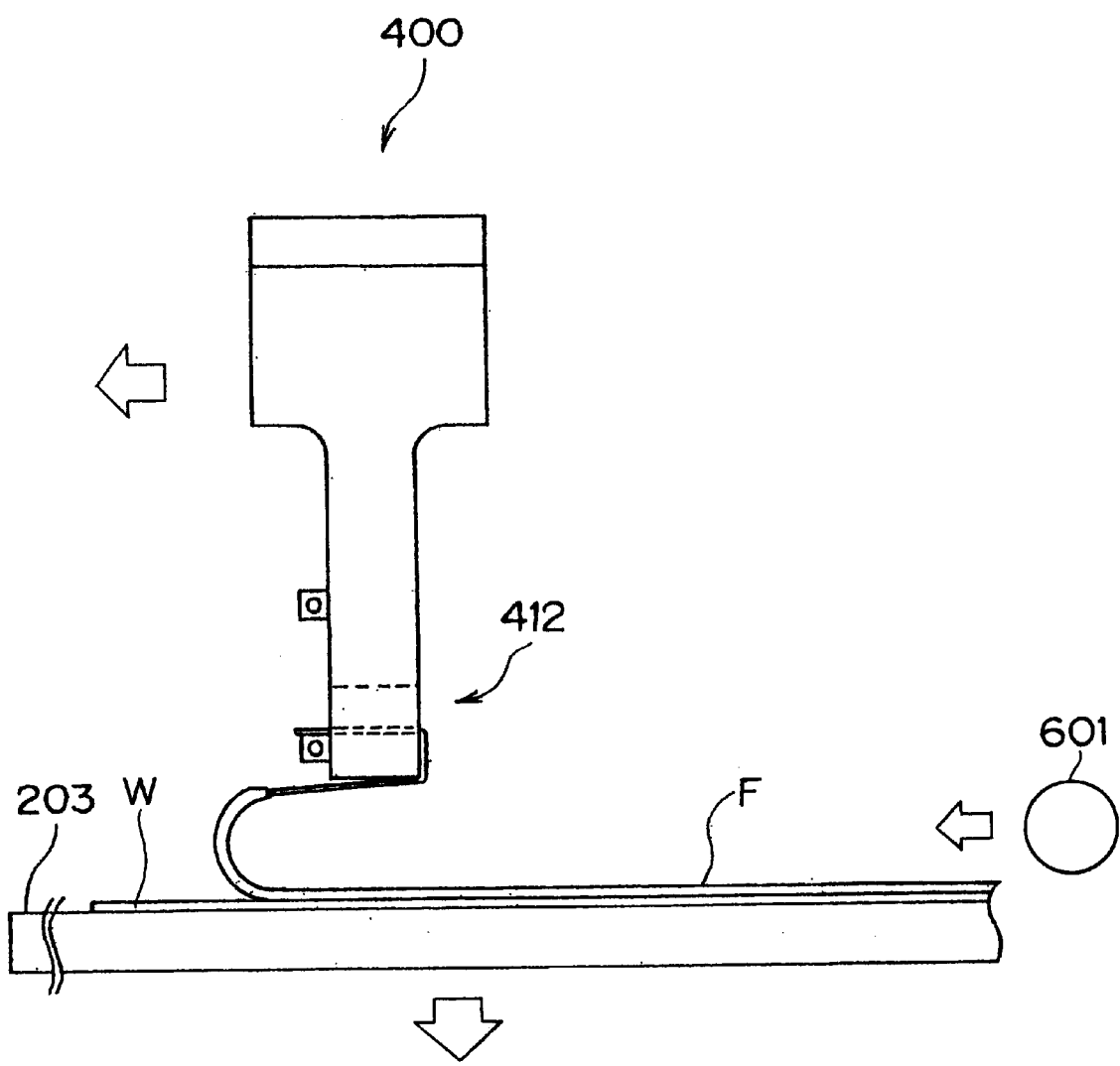

Then the table 203 is stopped as shown in FIG. 12 and the peeling head portion 400 is retracted slightly and table 203 descends. Simultaneously, the cylinder 609 (FIG. 5) is driven causing the guide roller 601 to move for a predetermined distance toward the peeling head portion 400, i.e., to the left in FIG. 12, whereupon the guide roller 601 is stopped.

As a result, the guide roller 601 is placed between the peeling head portion 400 and the table 203 as shown in FIG. 13. At this moment, the guide roller 601 may be brought into contact with the surface of the protecting sheet F or, alternatively, may be spaced slightly away from the protecting sheet F. Thereafter, the peeling head portion 400 is moved to the right as viewed in FIG. 13 and the table 203 is moved in the reverse direction, i.e., to the left, whereby the guide roller 601 is rotated along with the protecting sheet F allowing the protecting sheet F to be smoothly removed.

(Step 7: Disposing of the Protecting Sheet)

Figure 14:
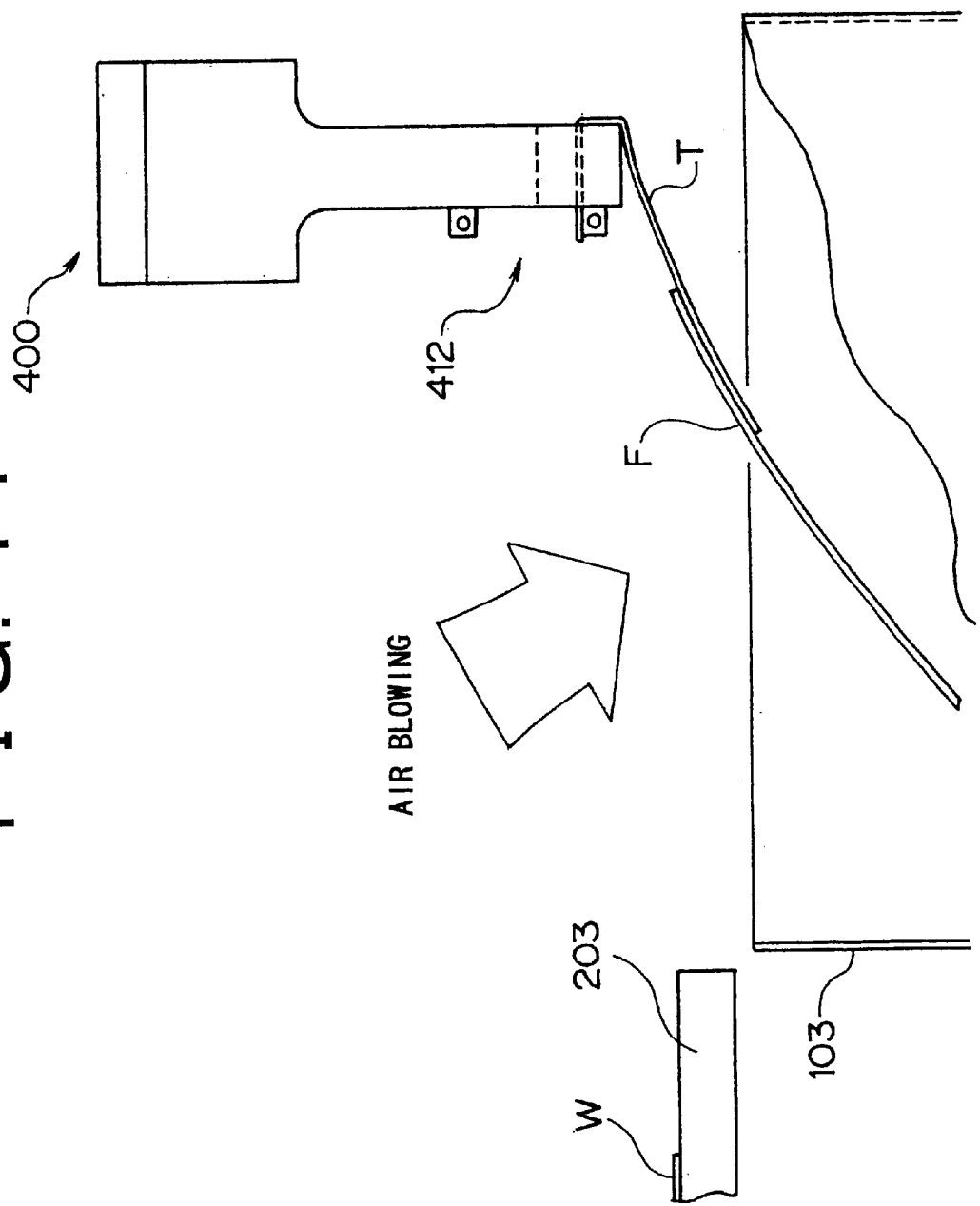

As shown in FIG. 14, when the peeling head portion 400 has been moved to a prescribed position, the tape chuck 412 is opened to drop the adhesive tape T and the protecting sheet F into a disposal box 103 housed inside the platform 100. At this time, disposal may be facilitated by blowing in high pressure air from above.

(Step 8: Retrieving the Wafer)

After sheet removal, the table 203 is returned to its original position and the wafer W is then retrieved manually or by an automated device.

With the foregoing arrangement and method, the protecting sheet F is removed by being pulled obliquely upwardly by the guide roller 601, so that the stress imposed upon the protecting sheet F is reduced thereby preventing the protecting sheet F from being torn off.

Furthermore, as the guide roller 601 is arranged in contact with or in the vicinity of the protecting sheet F, the upward movement of the wafers W is limited. As a result, it is possible to prevent the wafers W from being detached from the table 203 against the suction.

Moreover, since the guide roller 601 is used, it is possible to remove the protecting sheet F at a constant speed, without being stretched. More specifically, in the case that the protecting sheet F is directly pulled, the degree of stretch of the protecting sheet F would vary depending on the nature of the material forming the protecting sheet F so that it would be necessary to correspondingly lower the pull speed of the protecting sheet F. In contrast, when the protecting sheet F is pulled by means of the guide roller 601 as in the apparatus described, it is possible to avoid stretching of the protecting sheet F so that the protecting sheet F can be pulled at a constant speed to thereby shorten the removal time. For example, it is possible to increase the speed of removal even if a readily stretchable material having a low elasticity is selected for the protecting sheets F in combination with an adhesive having a high adhesion. Thus, the use of the guide roller 601 increases the flexibility of combination of the material for the protecting sheet F and the adhesive.

Although in the foregoing embodiment the guide roller 601 is held in a fixed position with the peeling head portion 400 and the table 203 being moved as the protecting sheet is removed, the invention is not limited thereby, and, for example, the table 203 may be held in a fixed position while moving the peeling head portion 400 and the guide roller 601.

Figure 15:
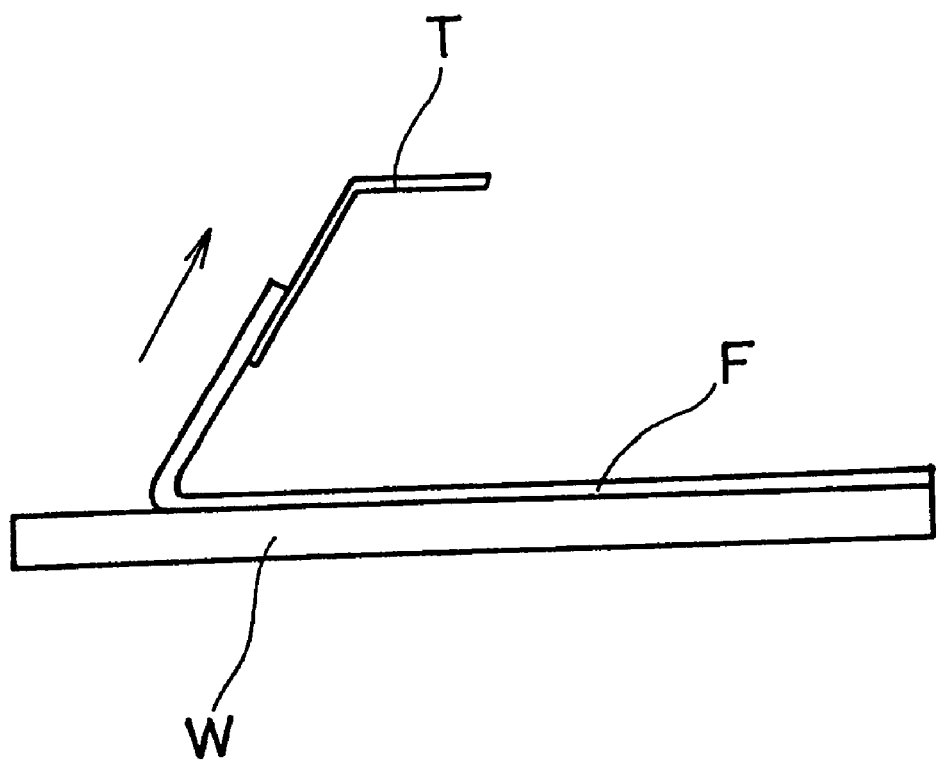
FIG. 15 is an illustration of another embodiment of the present invention.

While in the foregoing embodiment the arrangement is such that the protecting sheet F is pulled obliquely upwardly by the guide roller 601, the present invention is not limited thereby, and other guiding means including guide plate may be used in place of the guide roller 601. Guide means may not be used altogether. FIG. 15 illustrates an embodiment without a guide means wherein a tape T is bonded to the edge of the protecting sheet F applied to the wafer W and the tape T is pulled obliquely upwardly as shown by the arrow to remove the protecting sheet F.

Furthermore, even though the embodiment described above was provided with a cutting means comprised of a cutting blade for cutting the adhesive tape to a prescribed length, the present invention is not limited to such structure, and instead it is possible to use various other cutting means. Moreover, it is possible to omit the cutting means from the embodiment described above. For example, it is possible to eliminate the cutting step by starting with adhesive tape which has been pre-cut to appropriate length strips, and then using such a prescribed-length adhesive tape strip to bond to an edge portion of the protecting sheet F and then pulling such adhesive tape strip to peel away the protecting sheet F.

As described herein, according to the invention, it is possible to remove without failure the sheets applied to the plate-shaped members such as wafers without resulting stretching and tear of the sheets.

What is claimed is:

1. A sheet removing apparatus which uses an adhesive tape with a prescribed length and a tip end to remove a sheet applied to a plate-shaped member, comprising:
    bonding means for bonding the adhesive tape to an edge portion of the sheet;
    pulling means for pulling the tip end of the adhesive tape obliquely upwardly to remove the sheet from the plate-shaped member; and
    a cutter for cutting the adhesive tape to a prescribed length.

2. An apparatus of claim 1 wherein the cutter creates the tip end of a next prescribed length of adhesive tape by cutting the adhesive tape.

3. A sheet removing apparatus according to claim 1 wherein the pulling means is positioned to pull the tip end of the adhesive tape obliquely upward at an angle to the plate-shaped member in a range of 5° to 175°.

4. A sheet removing apparatus which uses an adhesive tape with a prescribed length and a tip end to remove a sheet applied to a plate-shaped member, comprising:
    bonding means for bonding the adhesive tape to an edge portion of the sheet;
    pulling means for pulling the tip end of the adhesive tape obliquely upwardly to remove the sheet from the plate-shaped member;
    a cutter for cutting the adhesive tape to a prescribed length; and
    a guide roller disposed in the vicinity of said sheet to ensure that said sheet is pulled as it is turned over said guide roller.

5. The sheet removing apparatus of claim 4, wherein said guide roller is disposed in such a position as to prevent upward movement of said plate-shaped member.

6. An apparatus of claim 4 wherein the cutter creates the tip end of a next prescribed length of adhesive tape by cutting the tape.

7. A method of removing a sheet applied to a plate-shaped member by using an adhesive tape with a prescribed length and a tip end, comprising the steps of:
    bonding a portion of the adhesive tape to an edge portion of the sheet;
    cutting an unbonded portion of the adhesive tape to a prescribed length with a cutter; and
    pulling the tip end of the adhesive tape obliquely upwardly to remove the sheet from the plate-shaped member.

8. A method of claim 7 wherein cutting an unbonded portion of the adhesive tape creates the tip end of a next prescribed length of adhesive tape.

9. A method according to claim 7 wherein the tip end is pulled obliquely upwardly at an angle to the plate-shaped members between 5° to 175°.

10. A method of removing a sheet applied to a plate-shaped member by using an adhesive tape with a prescribed length, comprising the steps of:
    bonding a portion of the adhesive tape to an edge portion of the sheet;
    cutting an unbonded portion of the adhesive tape; and
    pulling the adhesive tape with said sheet turned over a guide roller.

11. A method of claim 10, also comprising:
    positioning the guide roller such as to prevent upward movement of aid plate member.

12. A method of claim 10 wherein cutting an unbonded portion of the adhesive tape creates the tip end of a next prescribed length of adhesive tape.

* * * * *